(12) United States Patent
Beals

(10) Patent No.: US 9,390,299 B1
(45) Date of Patent: Jul. 12, 2016

(54) HIGH DATA TRANSFER SMART CARD READER WITH HEAT SINK

(71) Applicant: EchoStar Technologies L.L.C., Englewood, CO (US)

(72) Inventor: William Michael Beals, Englewood, CO (US)

(73) Assignee: EchoStar Technologies L.L.C., Englewood, CO (US)

( * ) Notice: Subject to any disclaimer, the term of this patent is extended or adjusted under 35 U.S.C. 154(b) by 0 days.

(21) Appl. No.: 14/631,734

(22) Filed: Feb. 25, 2015

(51) Int. Cl.
*G06K 19/06* (2006.01)
*G06K 7/00* (2006.01)
*H05K 1/02* (2006.01)

(52) U.S. Cl.
CPC ............ *G06K 7/0056* (2013.01); *H05K 1/0203* (2013.01)

(58) Field of Classification Search
USPC ........... 235/492, 451, 441; 361/737, 748, 751
See application file for complete search history.

(56) References Cited

U.S. PATENT DOCUMENTS

| | | | |
|---|---|---|---|
| 6,721,182 B1 | 4/2004 | Wells et al. | |
| 8,167,643 B2 * | 5/2012 | Yoshida | G06K 7/0047 439/485 |
| 8,172,619 B2 * | 5/2012 | Williams | G06K 7/0021 439/630 |
| 8,747,163 B2 * | 6/2014 | Little | G06K 7/04 439/159 |
| 9,076,050 B2 | 7/2015 | LaPalme et al. | |
| 2002/0050516 A1 * | 5/2002 | Kitchen | G06K 13/08 235/441 |
| 2011/0069456 A1 | 3/2011 | Brandon et al. | |
| 2011/0130029 A1 | 6/2011 | Yoshida et al. | |
| 2011/0300759 A1 * | 12/2011 | Ngo | H01R 12/7052 439/630 |
| 2013/0347051 A1 | 12/2013 | Bose et al. | |
| 2014/0162490 A1 * | 6/2014 | Hodge | G06K 7/00 439/487 |

FOREIGN PATENT DOCUMENTS

DE   20 2007 006 626 U1   10/2007
WO       2012/118545 A1    9/2012

OTHER PUBLICATIONS

Office Action from co-pending U.S. Appl. No. 14/752,626, mailed Mar. 3, 2016.
International Search Report from PCT/US2016/018637, mailing date May 9, 2016, 4 pages.

* cited by examiner

*Primary Examiner* — Ahshik Kim
(74) *Attorney, Agent, or Firm* — Seed IP Law Group PLLC

(57) ABSTRACT

Various embodiments provide a high data transfer smart card reader. In a preferred embodiment, the high data transfer smart card reader includes smart card contacts, a heat sink, a heat conductor, and a heat sink plate. The smart card contacts are configured to contact a pad in a contact area of a smart card to create an electrical connection. The heat sink is configured to physically contact a smart card to dissipate heat. The heat conductor and the heat sink plate are connected to the heat sink to maximize heat dissipation by increasing the surface area of the heat sink. The smart card contacts, the heat sink, the heat conductor, and the heat sink plate are secured to a circuit board by an encasing member.

25 Claims, 6 Drawing Sheets

HIGH DATA TRANSFER SMART CARD READER WITH HEAT SINK

TECHNICAL FIELD

The present disclosure generally relates to a smart card reader. In particular, the present disclosure is directed to a high data transfer smart card reader that includes a heat sink.

BACKGROUND

As more smart cards are deployed into the population, smart card readers have generally become ubiquitous in a variety of electronic devices, portable or not. A smart card, also known as a chip card or an IC card, refers to a card with dimensions similar to that of a credit card or a driver's license that houses an embedded circuit capable of providing identification, authentication, data storage, or applications. Certain signals of the embedded circuit are generally brought to the surface of the smart card through a number of contact pads. When inserted into a smart card reader, these contact pads provide electrical connectivity between the embedded circuit in the smart card and a host in which the smart card reader resides.

To effect the electrical connection between the smart card and the host, a connector is employed in the smart card reader to serve as the interface. The reader requires a physical connection to the smart card that is made by inserting the card into the reader. Two known technologies of insertion are (1) "sliding" contact technology and (2) "landing" contact technology. In general, sliding contact technology requires a "swipe" of the card to register the data on the card, thus providing convenience, while a landing contact technology requires the card to be placed completely inside the reader before data can be registered.

Past smart cards conform to ISO/IEC standards. While ISO 7810 standardizes the outer dimension of a smart card, or the card "envelope," ISO 7816 standardizes the location and signal connectivity of the smart card's contact pads. Eight contact pads are provided in the ISO 7816 standard, six of them are defined: VCC, GND, Reset, Clock, Vpp, Serial Data I/O, while two are Reserved for Future Use (RFU), RFU1 and RFU2.

Smart cards and readers beyond the current six leads are being designed. These cards may use more power and, thus, ways to dissipate heat from the card may be needed.

BRIEF SUMMARY

In accordance with the present disclosure, a high data transfer smart card reader that includes a heat sink is provided. In a preferred embodiment, the high data transfer smart card reader includes smart card contacts, a heat sink, a heat conductor, and a heat sink plate.

The smart card contacts are configured to contact a pad in a contact area of a smart card to create an electrical connection. The heat sink is configured to physically contact a smart card to remove heat more efficiently from the smart card. The heat sink plate is connected to the heat sink with a heat conductor to maximize heat dissipation by increasing the exposed surface area of the heat sink. In a preferred embodiment, the heat conductor includes a vent, the heat sink has a large surface area relative to the smart card contacts, and the heat sink plate has a large surface area relative to the heat sink. Preferably, the heat contact on the smart card is made of metal of high thermal conductibility, such as copper. The heat sink is also made of metal, preferably the same metal as the heat contact on the smart card.

The smart card contacts, the heat sink, the heat conductor, and the heat sink plate are secured to a circuit board by an encasing member. Particularly, the encasing member is attached to the circuit board and holds mounting portions of the smart card contacts, a support member of the heat sink, and a mounting bracket of the heat sink plate. In one embodiment, the encasing member includes openings that exposes the heat conductor and the heat sink plate to a surrounding cooling medium, and holes to allow a surrounding cooling medium to flow to and from a space below the encasing member.

BRIEF DESCRIPTION OF THE SEVERAL VIEWS OF THE DRAWINGS

The foregoing and other features and advantages of the present disclosure will be more readily appreciated as the same become better understood from the following detailed description when taken in conjunction with the accompanying drawings.

DETAILED DESCRIPTION

Figure 1:
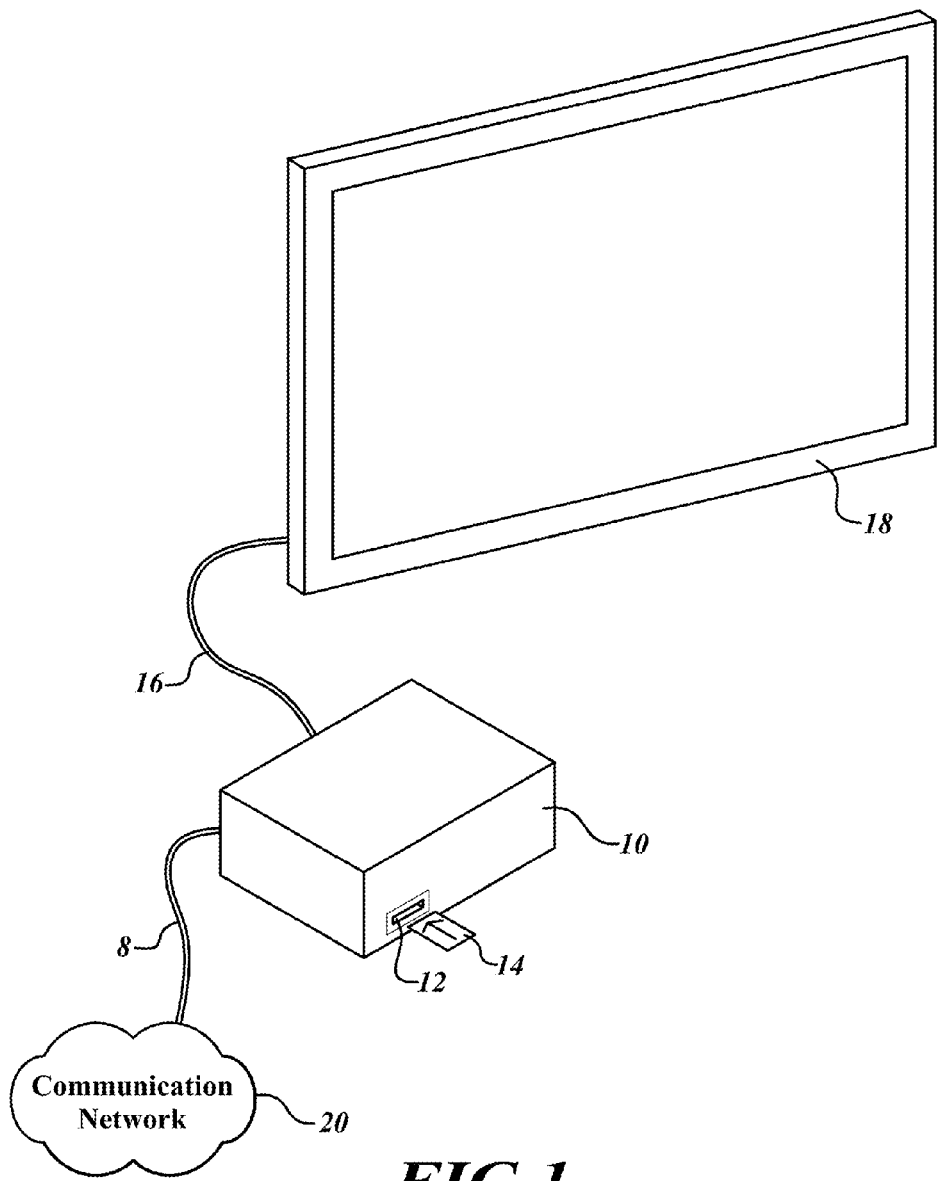
FIG. 1 illustrates an exemplary entertainment system that includes a client device in which an embodiment of the high data transfer smart card reader is implemented.

In the following description, certain specific details are set forth in order to provide a thorough understanding of various embodiments of the disclosure. However, one skilled in the art will understand that the disclosure may be practiced without these specific details. In some instances, well-known structures associated with the manufacturing of semiconductor wafers have not been described in detail to avoid obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment.

Furthermore, the particular features, structures, or characteristics may be combined in any suitable manner in one or more embodiments.

In the drawings, identical reference numbers identify similar features or elements. The size and relative positions of features in the drawings are not necessarily drawn to scale.

Each smart card has a contact area comprising several gold-plated contact pads. These contact pads provide electrical connectivity when inserted into a reader, which is used as a communication medium between the smart card and a host. The host provides power to the smart card through the reader. On a conventional smart card, the contact area is defined by the ISO/IEC standards. ISO 7816 defines a one square centimeter contact area comprising eight contact pads. ISO 7810 and ISO 7816 are standards well known in the art and will not be discussed in detail in this description.

It is contemplated that a more data intensive smart card with additional functions, such as data encryption and decryption, will soon be used in set-top boxes and as part of an improved conditional access security system. In some embodiments, the high data transfer smart card may require more than the conventional eight contact pads. Particularly, the high data transfer smart card may have twelve defined contact pads (e.g., CLK, RST, VCC, SC IN−, SC IN+, I/O, VPP, VSS, CLK−, CLK+, SC OUT−, SC OUT+) on one surface of the card, with eight of the contact pads being in the same location as the eight contact pads, including the RFUs, in the conventional smart card set forth by the ISO 7816 standard, two contact pads being added to each of the four-contact-pad rows, and two new contact pads being added in a row between the four-contact-pad rows. The ISO RFU1 and ISO RFU2 contact pads that are part of a conventional smart card may be omitted if not used. For example, see U.S. patent application Ser. No. 13/797,594 filed Mar. 12, 2013 and entitled "Enhanced smart card reader with multi-level reading contacts." With the additional functions and contact pads, the high data transfer smart card may generate significant internal heat. One particular issue is that the processor on board the high data transfer smart card may generate a large amount of heat that should be dissipated by more than just the contact pads.

A high data transfer smart card reader that includes a heat sink is provided. In a preferred embodiment, the high data transfer smart card reader is configured to read both the high data transfer smart card and the conventional smart card.

FIG. 1 illustrates a typical entertainment system of a subscriber to a broadcast service with a conditional access system. The entertainment system of FIG. 1 includes a client device 10 coupled to a display device 18 over a first cable 16 and to a communication network 20 over a second cable 8. The client device 10 has a high data transfer smart card reader 12 to receive and read a smart card 14.

The client device 10 receives program content transmitted from at least a content service provider (not shown) over the communication network 20. The program content may be in the form of video, audio, data, multimedia, or another form appropriate for transmission over the communication network 20. The communication network 20 facilitates the transmission of content from the content service provider to the client device 10. The communication network 20 may include any type of wired or wireless communication system, such as satellite, antenna, cable, and servers, in their associated network topologies. In a preferred embodiment, the content service provider is a direct broadcast satellite service provider transmitting content over a satellite communication network that includes antennas and satellites, and the client device 10 is a set top box.

The client device 10 is configured to receive program content from the communication network 20 and output the program content for display on the display device 18. Because some program content is made available only to subscribers who pay a premium, some program content may be protected to be accessible only to those subscribers. Such program content protection may be implemented by encrypting or scrambling the program content before it is transmitted to the client device 10. The client device 10, therefore, requires a decrypting or descrambling key or data to output the protected contents to the display device 18. The content service provider provides the premium paying subscriber with a smart card 14 containing the appropriate key or data. With the smart card 14 inserted in the high data transfer smart card reader 12, the client device 10 can access and use the encryption key in the smart card 14 to decrypt or descramble the protected program content. In a preferred embodiment, DVB-CSA and DVB-CI standards for content protection and conditional access is used. Other conditional access systems are also contemplated.

Figure 2:
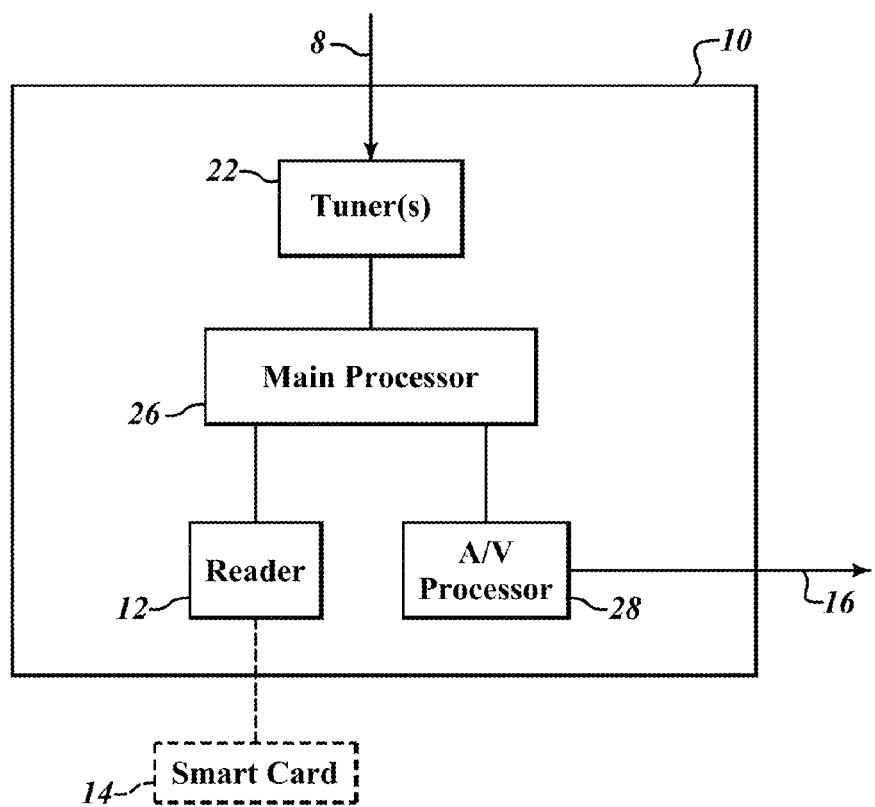
FIG. 2 is a block diagram of an exemplary client device in which one embodiment of the high data transfer smart card reader is implemented.

FIG. 2 shows a block diagram of an exemplary client device 10. The block diagram in FIG. 2 includes a tuner or tuners 22, a processor 26, an audio/video processor 28, and the high data transfer smart card reader 12. The client device 10 may include more functionalities and components than those illustrated in FIG. 2. Each module may be implemented in hardware, software, firmware or a combination thereof.

In prior systems, the client device 10 may include a descrambler or decoder that will decode the audio/video signal from the tuner. In the high data transfer smart card reader 12, the descramble circuit is on the smart card itself. Namely, rather than supply an encryption key or password to the processor 26, the encryption key stays in the smart card 14. The audio/video data stream is passed from the processor 26 to the high data transfer smart card reader 12 and to the smart card 14. The processor on the smart card 14 is a high data rate processor with full video and audio decode capability. The scrambled audio/video signal is passed to the high data transfer smart card reader 12 and on to the smart card 14. The processor on the smart card decrypts and descrambles the signal itself. After the smart card descrambles the audio/video data stream, it re-scrambles the signal with a local key and returns the re-scrambled signal to the processor 26 to be descrambled with the local key and routed to the audio/video processor 28 and then provided as an output to the display device 18 on cable 16. The audio/video processor 28 may be on the same integrated chip as the processor 26. Since the smart card 14 now processes the audio/video signal itself, it is to operate at a high data rate and processes a large amount of data. It is also performing a great deal of computing and consumes a great deal of computing power. The power consumed in the descrambling of the audio/video signal itself generates heat. In prior smart cards, only a small amount of computing took place and little to no excess heat was generated. In the high data transfer smart card 14, one of the core main processing tasks of the client device 10 is processed by the smart card 14 itself. Thus, the heat that was previously generated in the client device 10 is now generated on a small, thin smart card 14. It will be beneficial to have a structure that can remove this heat from the smart card 14 and dissipate it to a larger, more open space. The high data transfer smart card reader 12 provides a heat sink to remove the excess heat from the smart card 14 that is created by the high data computation that takes place on the smart card 14 itself.

The tuner(s) 22 is configured to receive a signal transmission on cable 8 that includes multiple program audio/video content and to extract a selected audio/video program content based on an input from a user. The extracted program content is forwarded to the smart card 14 which has a descramble module that is configured to decrypt or descramble protected program content. The processor 26 proceeds to oversee a data exchange between the descramble module on the smart card 14 to decrypt the signal coming from the tuner(s) 22 to decrypt or descramble the extracted program content. Once the program content is properly decrypted or descrambled, the program content is forwarded to the audio/video processor 28. Since the audio/video data stream itself passes onto and off of the smart card, a large amount of processing power is used, which creates heat that must be dissipated.

Figure 3:
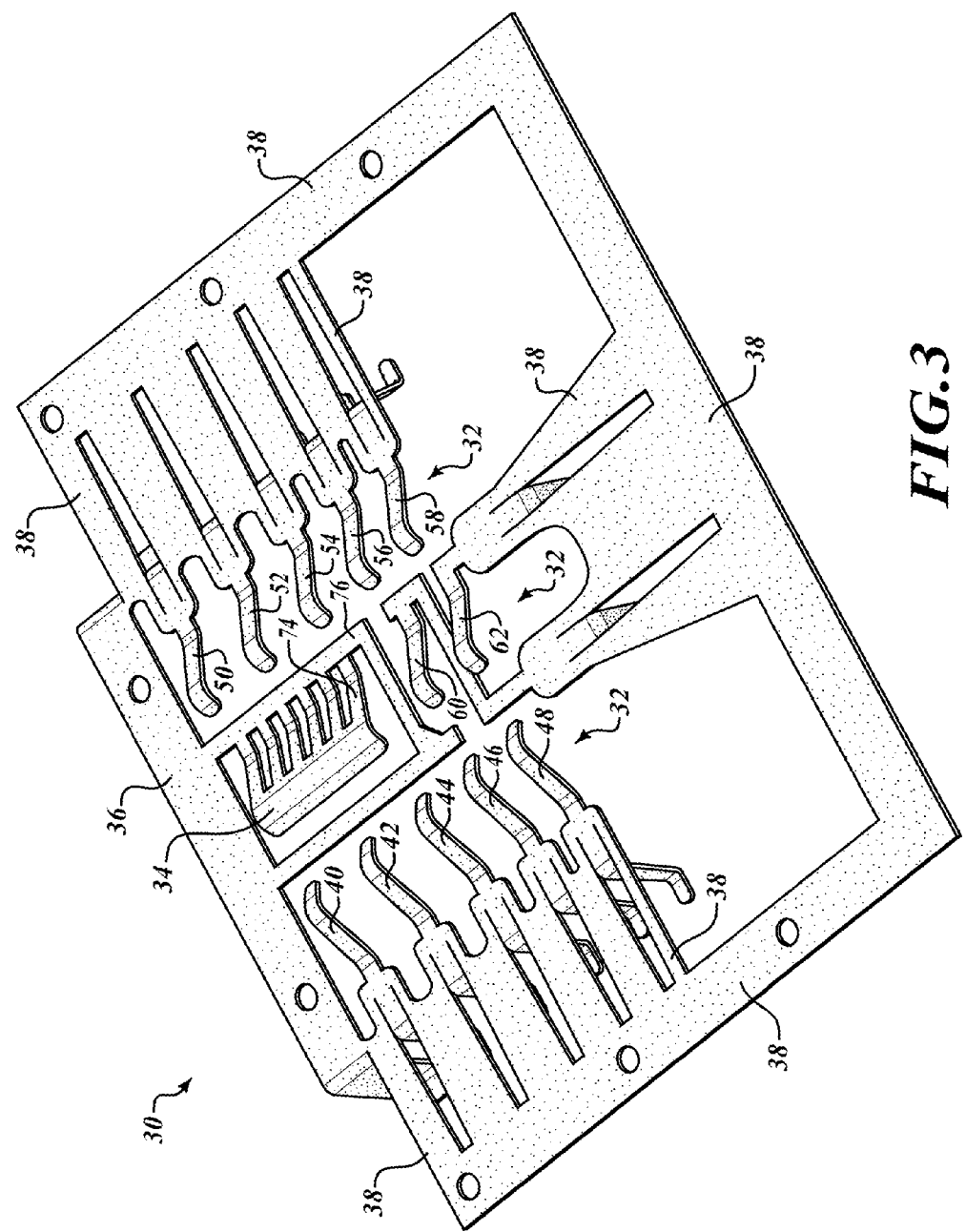
FIG. 3 illustrates a simplified angled view of a conductive frame including conductive components for one embodiment of the high data transfer smart card reader.

FIG. 3 illustrates a simplified angled view of a conductive frame 30 including conductive components in the high data transfer smart card reader 12 that contact the smart card 14. Particularly, the conductive frame 30 includes smart card contacts 32, a heat sink 34, a heat conductor 74, a support member 76, and a heat sink plate 36. The smart card contacts 32, the heat sink 34, and the heat sink plate 36 are coupled to each other by connecting portions 38.

The conductive frame 30 may be formed using techniques now known or later developed. For example, the conductive frame 30 may be formed by stamping a flat sheet of conductive material using a forming press. Conductive materials may include materials commonly used for electrical contacts, such as copper, aluminum, tungsten, silver, gold, titanium, platinum, tantalum, or combinations thereof. A preferred material is a copper alloy. The conductive frame 30 may also have gold plating on the contact portions.

Forming the heat sink 34 and the heat sink plate 36 simultaneously with the smart card contacts 32 adds little to no additional cost to the cost of forming of smart card contacts for conventional smart card readers. Particularly, when smart card contacts are formed for conventional smart card readers, excess material is removed from the smart card contacts and is disposed of or recycled. For the high data transfer smart card reader 12, the excess material is repurposed to form the heat sink 34 and the heat sink plate 36, rather than being disposed of or recycled. As such, no additional conductive material is needed to form the heat sink 34 and the heat sink plate 36.

The smart card contacts 32 include smart card contacts 40, 42, 44, 46, 48, 50, 52, 54, 56, 58, 60, and 62. Each of the smart card contacts 32 are configured to create electrical connections with contact pads on the smart card 14. For example, smart card contacts 40, 42, 44, 46, 48, 50, 52, 54, 56, 58, 60, and 62 may be configured to create electrical connections with the CLK, RST, VCC, SC IN−, SC IN+, I/O, VPP, VSS, CLK−, CLK+, SC OUT−, SC OUT+ contact pads, respectively, of a high data transfer smart card. The smart card contacts 32 will be discussed in further detail with respect to FIGS. 4-5. It should be noted that, although the smart card contacts 32 include twelve smart card contacts formed in adjacent rows, the high data transfer smart card reader 12 may include any number of smart card contacts and have any configuration.

The heat sink 34 makes physical contact with the smart card 14 and dissipates and conducts internal heat generated by the smart card 14. The surface area of the heat sink 34 is large to increase its contact with the smart card 14 and a surrounding cooling medium, such as air. In a preferred embodiment, the heat sink 34 is positioned to make physical contact near the center of the contact area of the smart card 14 for a metal-to-metal contact. The heat sink 34 will be discussed in further detail with respect to FIGS. 4-5.

The heat sink 34 is physically coupled to the heat sink plate 36 by the heat conductor 74 and the support member 76. The support member 76 could be considered a portion of the heat conductor 74 as well. The heat sink plate 36 is configured to maximize heat dissipation by increasing the surface area of the contact portion of the heat sink 34. As will be discussed with respect to FIG. 5, the heat sink plate 36 is coupled to a ground plane of a circuit board. In a preferred embodiment, the heat sink plate 36 has a large surface area relative to the contact portion of the heat sink 34 and the smart card contacts 32 to maximize heat dissipation. The heat sink plate 36 will be discussed in further detail with respect to FIGS. 4-5. In an alternative embodiment, the conductive frame 30 does not include the heat sink plate 36 and the heat conductor 74 is sufficient to remove the heat from the smart card 14.

Figure 4:
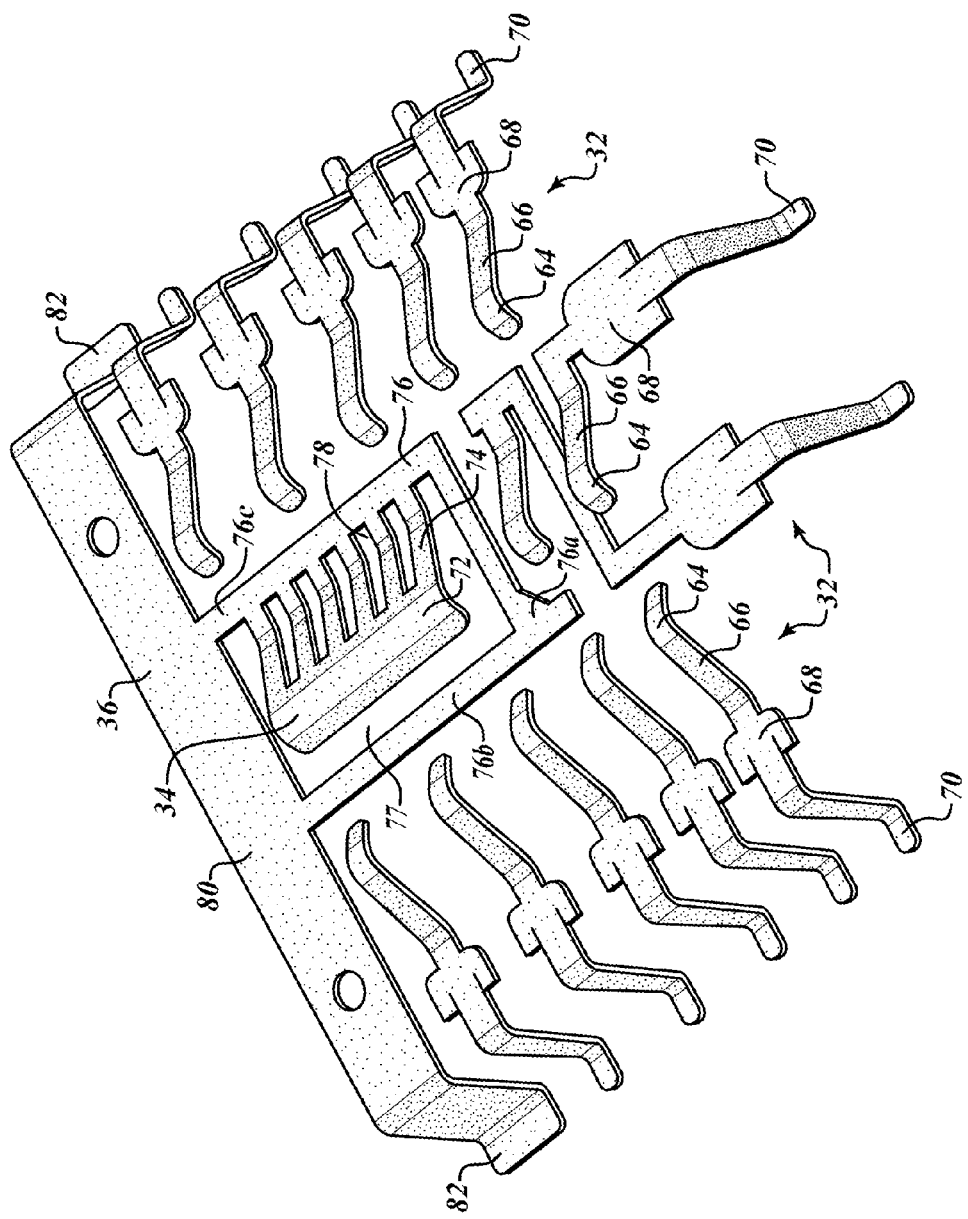
FIG. 4 illustrates a simplified angled view of the conductive components removed from the conductive frame of FIG. 3.

FIG. 4 illustrates a simplified angled view of the conductive components removed from the conductive frame 30. The smart card contacts 32, the heat sink 34, and the heat sink plate 36 are separated from the conductive frame 30 by removing the connecting portions 38. The connecting portions 38 may be removed using techniques now known or later developed. For example, the connecting portions 38 may be removed by stamping the conductive frame 30 using a forming press. Alternatively, the connecting portions 38 are cut by lasers or are removed by a chemical etch.

As illustrated in FIG. 4, the smart card contacts 32 each include a smart card contact portion 64, an arm portion 66, a mounting portion 68, and a circuit board contact portion 70. The smart card contact portion 64 is configured to contact a pad in the contact area of the smart card 14 to create an electrical connection. The smart card contact portion 64 is connected to the arm portion 66. The arm portion 66 is cantilevered from the mounting portion 68. As will be illustrated with respect to FIGS. 5-6, the arm portion 66 raises the smart card contact portion 64 to be above an encasing member. The mounting portion 68 is connected to the circuit board contact portion 70. As will be discussed in further detail with respect to FIG. 5, the mounting portion 68 is secured to a circuit board by an encasing member, and the circuit board contact portion 70 is configured to contact a pad of a circuit board to create an electrical connection.

The heat sink 34 includes a smart card heat sink contact portion 72, a heat conductor 74, and a support member 76. The smart card heat sink contact portion 72 is configured to make physical contact with the smart card 14. In a preferred embodiment, the smart card heat sink contact portion 72 has a large surface area relative to the smart card contact portion 64 of the smart card contacts 32 to increase thermal and heat transfer contact with the smart card 14. The smart card heat sink contact portion 72 is connected to the heat conductor 74. As will be illustrated with respect to FIGS. 5-6, the heat conductor 74 is cantilevered from the support member 76 and raises the smart card heat sink contact portion 72 to be above an encasing member. As will be discussed in further detail with respect to FIG. 5, the support member 76 is secured to a circuit board by an encasing member. In one embodiment, the heat conductor 74 includes a vent 78 or open slots between various fingers. This assists to provide a wider surface contact between the surrounding air and the heat conductor 74. Air can also flow around the vent 78 to help remove heat via the heat conductor 74. It also tends to spread the heat over a larger surface area. As will be discussed in further detail with respect to FIG. 6, the vent 78 is also configured to allow a surrounding cooling medium, such as air, to flow to and from a space below an encasing member. The heat conductor 74 is directly connected to the support member 76. The support member 76 has additional surface area that can accept and remove heat. The support member 76 has legs 76a, 76b, and 76c that extend around the heat sink 34, and has an open area 77 that further permits airflow and dissipates heat. The additional legs 76a, 76b, and 76c provide more metal for receiving and transferring heat, and an additional physical contact to heat sink plate 36 to more quickly transfer heat from the heat sink 34 to the heat conductor 74, to the support member 76 and by legs 76a, 76b, 76c to the heat sink plate 36. The two-point contact from the heat sink 34 to the heat sink plate 36 assists with the rapid transfer of heat away from the smart card 14. Thus, the heat can be dissipated into the area by the vent 78 around the heat conductor 74, and it can also be transferred by contiguous metal strips from the heat sink 34 to the heat sink plate 36 via the heat conductor 74 and mounting arms of the support member 76.

The heat sink plate 36 includes a mounting bracket 80 and a circuit board contact portion 82. The mounting bracket 80 is connected to the support member 76 by legs 76b and 76c to increase heat dissipation by increasing the surface area of the heat sink 34. In a preferred embodiment, the mounting bracket 80 has a large surface area relative to the smart card contact portion 64 of the smart card contacts 32 and to the smart card heat sink contact portion 72 of the heat sink 34. As will be discussed in further detail with respect to FIG. 5, in one embodiment, the mounting bracket 80 is secured to a circuit board by an encasing member, and the circuit board contact portion 82 is configured to contact a ground plate of a circuit board.

Figure 5:
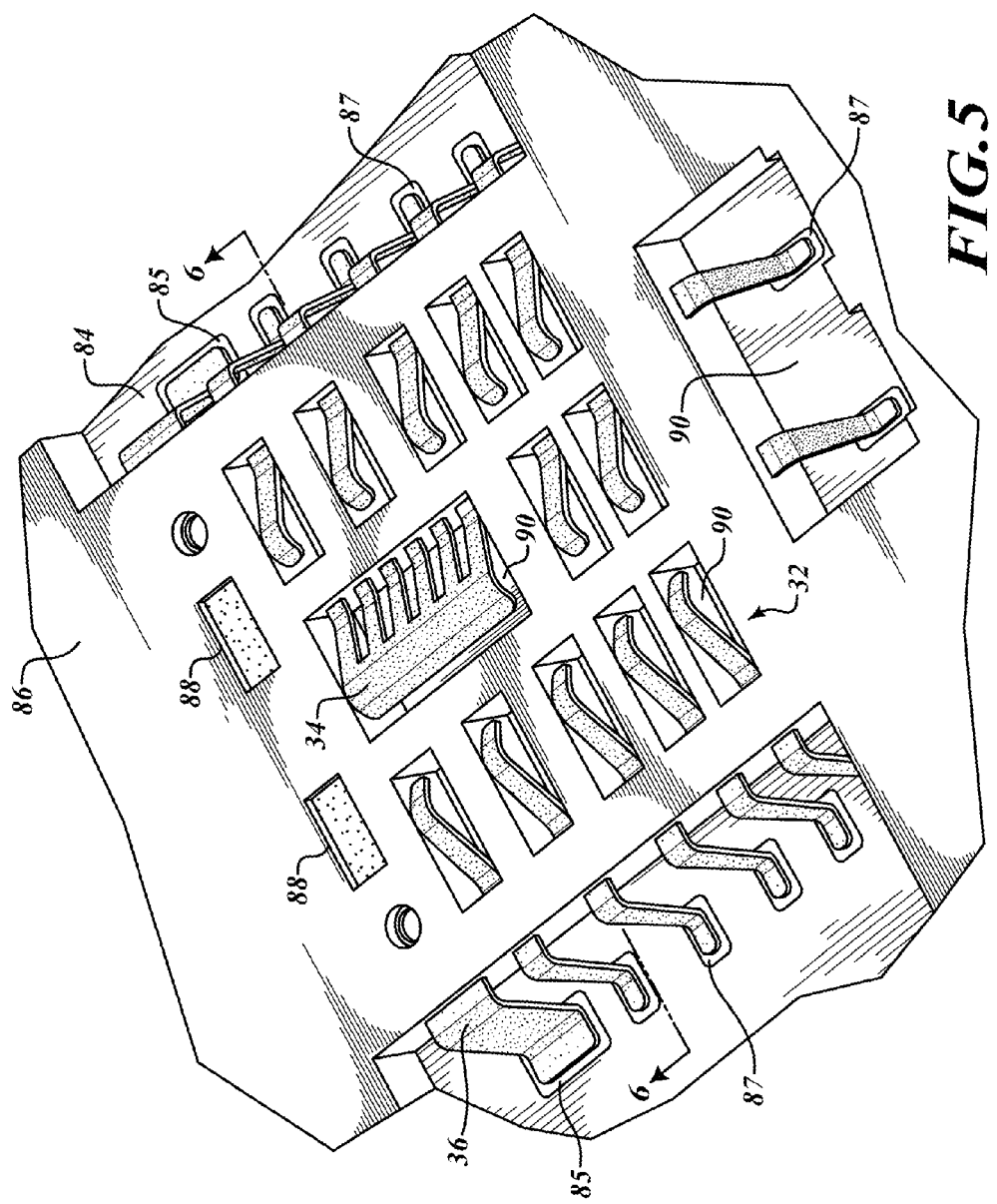
FIG. 5 illustrates a simplified angled view of the conductive components of FIG. 4 mounted to a circuit board for one embodiment of the high data transfer smart card reader.

FIG. 5 illustrates a simplified angled view of the smart card contacts 32, the heat sink 34, and the heat sink plate 36 being mounted to a circuit board 84 of the high data transfer smart card reader 12 by an encasing member 86.

The circuit board 84 includes an embedded circuit capable of providing, for example, identification, authentication, data storage, applications, data encryption, and data decryption. The circuit board 84 includes a ground plate 85 and contact pads 87. Although not shown in FIG. 5, the circuit board 84 may also include electrical components of the tuner(s) 22, the processor 26, and the audio/video processor 28, such as transistors, inductors, resistors, and capacitors.

The encasing member 86 secures the smart card contacts 32, the heat sink 34, and the heat sink plate 36 to the circuit board 84. Particularly, the encasing member 86 is attached to the circuit board 84 and holds the smart card contacts 32, the support member 76 of the heat sink 34, and the mounting bracket 80 of the heat sink plate 36. For example, see the simplified cross-sectional view illustrated in FIG. 6. The encasing member 86 secures the smart card contacts 32, the heat sink 34, and the heat sink plate 36 to the circuit board 84 such that the circuit board contact portion 70 and the circuit board contact portion 82 are in contact with the contact pads 87 and the ground plate 85, respectively, of the circuit board 84, and the smart card contact portion 64 and the smart card heat sink contact portion 72 are in contact with the smart card 14. The encasing member 86 may be made of non-conductive materials commonly used for smart card readers, such as plastic.

In a preferred embodiment, the encasing member 86 includes openings 88 that overlay the mounting bracket 80 of the heat sink plate 36 to increase the exposed surface area of heat sink plate 36 with a surrounding cooling medium, such as air. In a further embodiment, the encasing member 86 includes holes 90. As will be discussed in further detail with respect to FIG. 6, the holes 90 are configured to allow a surrounding cooling medium, such as air, to flow to and from a space below an encasing member.

Figure 6:
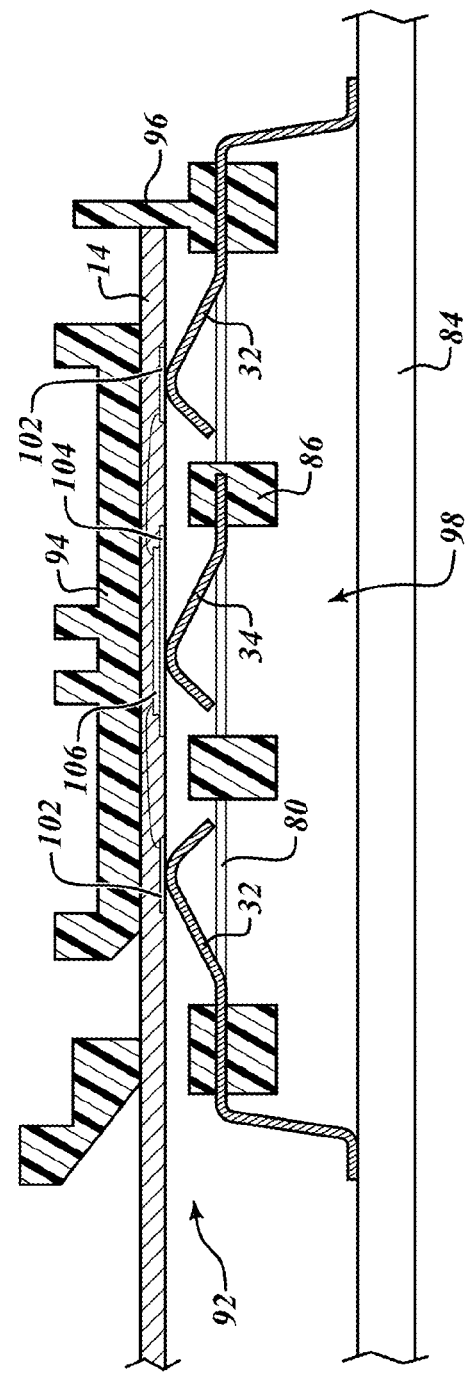
FIG. 6 illustrates a simplified cross-sectional view, along the axis shown in FIG. 5, of one embodiment of the high data transfer smart card reader with a smart card inserted in to an entry.

FIG. 6 illustrates a simplified cross-sectional view, along the axis shown in FIG. 5, of one embodiment of the high data transfer smart card reader 12 with the smart card 14 inserted in to an entry 92. The smart card 14 includes contact pads 102, a heat transfer plate 104, and an integrated circuit chip 106. The smart card 14 is shown after it has been pushed and slid between the encasing member 86 and a guide 94. As the smart card 14 is pushed in to the high data transfer smart card reader 12, the contact pads 102 makes physical contact with and exerts a force on the smart card contact portion 64 of the smart card contacts 32. Similarly, the heat transfer plate 104 makes physical contact with and exerts a force on the smart card heat sink contact portion 72 of the heat sink 34. The smart card 14 comes to a rest when it reaches a stop 96 of the high data transfer smart card reader 12.

The integrated circuit chip 106 is configured to perform processing for the smart card 14, such as decrypting or descrambling protected program content as previously discussed. The contact pads 102 are electrically coupled to the integrated circuit chip 106 and provide data input/output to the smart card contacts 32. The heat transfer plate 104 is physically coupled to the integrated circuit chip 106 and provides a metal contact for thermal and heat transfer to the heat sink 34. In a preferred embodiment, the integrated circuit chip 106 sits physically on top of the heat transfer plate 104. For example, the integrated circuit chip 106 may be coupled to the heat transfer plate 104 by a thermally conductive adhesive. In addition, in a preferred embodiment, the heat transfer plate 104 is positioned to make physical contact near the center of the contact area of the smart card 14 for a metal-to-metal contact. Also, in a preferred embodiment, the heat transfer plate 104 has a large surface area relative to the contact pads 102 to increase thermal and heat transfer contact with the heat sink 34.

In a preferred embodiment, the encasing member 86 is raised such that there is a space 98 between the smart card contacts 32, the heat sink 34, and the heat sink plate 36 and the circuit board 84. The space 98 allows the smart card contacts 32, the heat sink 34, and the heat sink plate 36 to come in to contact with a surrounding cooling medium, such as air. For example, a fan may be configured to draw in air and create an air flow along a path that goes through the space 98 and out the holes 90 of the encasing member 86 and the vent 78 of the heat sink 34.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A smart card reader device, comprising:
a circuit board;
an encasing member;
a first row of a first plurality of smart card contacts;
a second row of a second plurality of smart card contacts, each of the first and the second plurality of smart card contacts including a circuit board contact portion electrically coupled to the circuit board, a mounting portion held secure to the circuit board by the encasing member, and a smart card contact portion configured to make an electrical connection with a contact pad on a first surface of a smart card;

a heat sink positioned between the first row of the first plurality of smart card contacts and the second row of the second plurality of smart card contacts, the heat sink including a smart card heat sink contact portion configured to make physical contact with the first surface of the smart card; and a heat sink plate physically coupled to the heat sink.

2. The smart card reader device according to claim 1, further including a support member held secure to the circuit board by the encasing member, the smart card heat sink contact portion being cantilevered from the support member.

3. The smart card reader device according to claim 2, wherein the heat sink plate includes a mounting bracket held secure to the circuit board by the encasing member, the mounting bracket being physically coupled to the support member of the heat sink.

4. The smart card reader device according to claim 3, wherein the mounting portion, the support member, and the mounting bracket are in a first plane.

5. The smart card reader device according to claim 1, wherein the circuit board includes a ground plane, and the heat sink plate includes a circuit board contact portion coupled to the ground plane.

6. The smart card reader device according to claim 1, wherein the smart card contact portion of each of the first and second plurality of smart card contacts has a first surface area, and the smart card heat sink contact portion of the heat sink has a second surface area that is at least three times larger than the first surface area.

7. The smart card reader device according to claim 6, wherein the heat sink plate includes a mounting bracket held secure to the circuit board by the encasing member, the mounting bracket having a third surface area that is larger than the second surface area.

8. The smart card reader device according to claim 1, further including a heat conductor physically coupled to the heat sink, the heat conductor including a vent.

9. The smart card reader device according to claim 1, wherein the first row of the first plurality of smart card contacts and the second row of the second plurality of smart card contacts are aligned in a first direction, and the heat sink has a width and a length that is larger than the width, the length of the heat sink being substantially parallel to the first direction.

10. The smart card reader device according to claim 1, wherein the first row of the first plurality of smart card contacts and the second row of the second plurality of smart card contacts are aligned in a first direction, the heat sink plate has a width and a length that is larger than the width, the length of the heat sink plate being substantially perpendicular to the first direction.

11. The smart card reader device according to claim 1, wherein at least a portion of the encasing member is spaced from the circuit board.

12. The smart card reader device according to claim 1, wherein the encasing member includes an opening overlapping the heat sink plate.

13. The smart card reader device according to claim 1, wherein the encasing member includes a plurality of apertures, the smart card contact portion of each of the first and second plurality of smart card contacts and the smart card heat sink contact portion of the heat sink each overlying respective apertures of the plurality of apertures.

14. A smart card reader device, comprising:
an encasing member;
a first row of a first plurality of smart card contacts;
a second row of a second plurality of smart card contacts, each of the first and the second plurality of smart card contacts including a circuit board contact portion configured to be electrically coupled to a circuit board, a mounting portion held secure by the encasing member, and a smart card contact portion configured to make an electrical connection with a contact pad on a first surface of a smart card, the smart card contact portion of each of the first and second plurality of smart card contacts having a first surface area;

a heat sink including a smart card heat sink contact portion configured to make physical contact with the first surface of the smart card, the smart card heat sink contact portion of the heat sink having a second surface area that is at least three times larger than the first surface area; and a heat sink plate physically coupled to the heat sink.

15. The smart card reader device according to claim 14, further including a support member, the heat sink plate being physically coupled to the heat sink by the support member, the smart card heat sink contact portion being cantilevered from the support member.

16. The smart card reader device according to claim 15, further including a heat conductor physically coupled to the heat sink and the support member, the heat conductor including a vent.

17. The smart card reader device according to claim 14, wherein the heat sink plate includes a mounting bracket held secure by the encasing member, the mounting bracket having a third surface area that is larger than the second surface area.

18. The smart card reader device according to claim 14, wherein the heat sink is positioned between the first row of the first plurality of smart card contacts and the second row of the second plurality of smart card contacts.

19. The smart card reader device according to claim 14, wherein the encasing member includes an opening overlapping the heat sink plate.

20. A smart card reader device, comprising:
a circuit board;
an encasing member;
a first row of a first plurality of smart card contacts;
a second row of a second plurality of smart card contacts, each of the first and the second plurality of smart card contacts including a circuit board contact portion electrically coupled to the circuit board, a mounting portion held secure to the circuit board by the encasing member, and a smart card contact portion configured to make an electrical connection with a contact pad on a first surface of a smart card; and a heat sink positioned between the first row of the first plurality of smart card contacts and the second row of the second plurality of smart card contacts, the heat sink including a smart card heat sink contact portion configured to make physical contact with the first surface of the smart card.

21. The smart card reader device according to claim 20, further including a heat conductor physically coupled to the heat sink, the heat conductor including a vent.

22. The smart card reader device according to claim 20, wherein the first row of the first plurality of smart card contacts and the second row of the second plurality of smart card contacts are aligned in a first direction, and the heat sink has a width and a length that is larger than the width, the length of the heat sink being substantially parallel to the first direction.

23. A smart card reader device, comprising:
an encasing member;
a first row of a first plurality of smart card contacts;
a second row of a second plurality of smart card contacts, each of the first and the second plurality of smart card contacts including a circuit board contact portion configured to be electrically coupled to a circuit board, a mounting portion held secure by the encasing member, and a smart card contact portion configured to make an electrical connection with a contact pad on a first surface of a smart card; and a heat sink including a conductive lead held secure by the encasing member, a single and contiguous smart card heat sink contact portion configured to make physical contact with the first surface of the smart card, and a heat conductor physically coupled to the conductive lead and the smart card heat sink contact portion, the heat conductor and the smart card heat sink contact portion being cantilevered from the conductive lead, the heat conductor having a plurality of apertures positioned between the conductive lead and the smart card heat sink contact portion.

24. The smart card reader device according to claim 23, further comprising:

a heat sink plate physically coupled to the heat sink, the heat sink plate having a circuit board contact portion, the circuit board having a ground plane coupled to the circuit board contact portion.

25. The smart card reader device according to claim 24, wherein the first row of the first plurality of smart card contacts and the second row of the second plurality of smart card contacts are aligned in a first direction, the heat sink plate has a width and a length that is larger than the width, the length of the heat sink plate being substantially perpendicular to the first direction.

* * * * *